«12» United States Patent
Poon et al.

（10） Patent No.: US 10,396,656 B1
（45） Date of Patent: Aug. 27, 2019

（54） CONTROL CIRCUIT FOR SUPPRESSING ELECTROMAGNETIC INTERFERENCE SIGNALS

（71） Applicant: AnApp Technologies Limited, Kowloon, Hong Kong (CN)

（72） Inventors: Franki Ngai Kit Poon, Hong Kong (CN); Peter On Bon Chan, Hong Kong (CN)

（73） Assignee: AnApp Technologies Limited, Kowloon, Hong Kong (CN)

（ * ） Notice: Subject to any disclaimer, the term of this patent is extended or adjusted under 35 U.S.C. 154(b) by 0 days.

（21） Appl. No.: 16/185,275

（22） Filed: Nov. 9, 2018

（51） Int. Cl.
*H02M 1/44* (2007.01)
*H03H 11/12* (2006.01)

（52） U.S. Cl.
CPC .......... *H02M 1/44* (2013.01); *H03H 11/126* (2013.01); *H03H 11/1291* (2013.01); *H03H 2210/025* (2013.01); *H03H 2210/028* (2013.01)

（58） Field of Classification Search
CPC .... H02M 1/44; H03H 11/126; H03H 11/1291

USPC ...................................... 327/551, 553, 554
See application file for complete search history.

（56） References Cited

U.S. PATENT DOCUMENTS

| | | | | |
|---|---|---|---|---|
| 6,052,420 A * | 4/2000 | Yeap | ........................ | H04B 15/00 375/258 |
| 6,940,973 B1 * | 9/2005 | Yeap | ........................ | H04M 3/18 375/285 |

* cited by examiner

*Primary Examiner* — William Hernandez
(74) *Attorney, Agent, or Firm* — Leydig, Voit & Mayer

（57） ABSTRACT

A control circuit for suppressing electromagnetic interference signal has an input and an output and a variable gain filter circuit with a first gain factor that is variable. The variable gain filter circuit receives a signal indicative of an electromagnetic interference signal and outputs a signal to a controlled signal source, which a second gain factor. The control circuit also has a controller operably connected to the variable gain filter circuit. The controller receives a signal indicative of an output signal at the output of the control circuit and outputs a control signal to the variable gain filter circuit. The control signal is based on the signal indicative of the output signal at the output of the control circuit, and the control signal controls the first gain factor and reduces the electromagnetic interference signal.

23 Claims, 7 Drawing Sheets

CONTROL CIRCUIT FOR SUPPRESSING ELECTROMAGNETIC INTERFERENCE SIGNALS

TECHNICAL FIELD

The invention relates to suppression of electromagnetic interference signals conducted in signal or power lines in electric circuits.

BACKGROUND

Electromagnetic interference suppression circuits are known and are commonly used for suppressing conducted electromagnetic interference signals present on a signal or power line. These conducted electromagnetic interference signals can be classified into differential mode electromagnetic interference signals, which are conducted on the power supply line and the power return line in opposite directions, and common mode electromagnetic interference signals, which are conducted on the power supply line and the power return line in the same direction.

In theory, an electromagnetic interference suppression circuit is able to generate a suppression signal that can reduce or even eliminate the unwanted electromagnetic interference signal. For the best suppression performance, the generated suppression signal should be a negative of the electromagnetic interference signal (e.g., equal in magnitude and anti-phase) so that the two always completely cancel each other.

In practice, however, a substantial or complete cancellation can be difficult to achieve. First, a gain factor of the circuit has to be precisely controlled to be equal to unity to match the amplitude of the suppression signal with the amplitude of the electromagnetic interference signal. But such gain factor is affected by various factors including the environment in which the circuit is arranged, intrinsic parameters of components of the circuit, the deterioration of circuit components over time, the operation condition of the circuit, etc. These factors cause undesirable performance variation during production as well as throughout the operating life of the circuit. Second, the suppression signal has to be precisely controlled to be about 180 degrees out of phase with the electromagnetic interference signal voltage (when the suppression signal is a voltage signal), or substantially in phase with the electromagnetic interference signal current (when the suppression signal is a current signal). Another difficulty with the implementation of electromagnetic interference suppression circuits relates to feedback control. In particular, the use of amplifiers or like circuit components with high gain and good phase characteristic would easily introduce undesirable side effects such as instability and oscillation to the circuit.

SUMMARY OF THE INVENTION

It is an object of the invention to address the above needs, to overcome or substantially ameliorate the above disadvantages or, more generally, to provide an improved or alternative control circuit for suppressing electromagnetic interference signals. It is another object of the invention to provide an electromagnetic interference signals suppression control circuit that can be easily integrated into an integrated circuit.

In accordance with a first aspect of the invention, there is provided a control circuit for suppressing electromagnetic interference (noise) signal, the control circuit having an input and an output, and comprising: a variable gain filter circuit with a first gain factor that is variable, the variable gain filter circuit being arranged to receive a signal indicative of an electromagnetic interference signal; and output a signal to a controlled signal source with a second gain factor; and a controller operably connected with the variable gain filter circuit, the controller being arranged to receive a signal indicative of an output signal at the output of the control circuit; and output a control signal to the variable gain filter circuit based on the received signal so as to control the first gain factor to minimize (or at least reduce) the electromagnetic interference signal.

Preferably, the control circuit further includes the controlled signal source, which is arranged to: receive the signal outputted from the variable gain filter circuit; and output a suppression signal that is arranged to suppress transfer of an electromagnetic interference signal from a first circuit part to a second circuit part.

Preferably, the first circuit part is connected with the input of the control circuit and the first circuit part comprises a load circuit. Also, preferably, the second circuit part is connected with the output of the control circuit and the second circuit part comprises a power supply circuit.

In one embodiment of the first aspect, the suppression signal has a first phase and the electromagnetic interference signal has a second phase. When the electromagnetic interference signal is a voltage signal, the first phase and the second phase are out of phase by about 180 degrees. Alternatively, when the electromagnetic interference signal is a current signal, the first phase and the second phase are substantially in phase. The suppression signal has a first magnitude and the electromagnetic interference signal has a second magnitude, and the first magnitude and the second magnitude may be substantially the same.

Preferably, the control signal is arranged to adjust the first gain factor such that a product of the first gain factor and the second gain factor is substantially equal to 1, for example, between 0.9 to 1.1. The gain factor affects the amplitude of the suppression signal outputted by the controlled signal source. A factor close to or equal to 1 ensures that the amplitude of the suppression signal is close to or the same as the amplitude of the electromagnetic interference signal. With suitable phase shift, the electromagnetic interference signal can be substantially suppressed by the suppression signal.

Preferably, the variable gain filter circuit is a high pass filter circuit.

In one implementation, the variable gain filter circuit comprises: an operational amplifier with an inverting input, a non-inverting input, and an output; and a variable resistance circuit connected between the inverting input and the output. The variable resistance circuit provides a resistance that can be varied, by the controller control signal, to change the first gain factor.

In one embodiment of the first aspect, the variable resistance circuit comprises a plurality of resistor each respective connected in parallel with a switch. Alternatively, the variable resistance circuit comprises a switched capacitor.

Preferably, the electromagnetic interference signal is a voltage signal or a current signal at the input of the control circuit. The signal indicative of an electromagnetic interference signal may be the electromagnetic interference signal itself or a portion of the electromagnetic interference signal.

Preferably, the control circuit further includes a detector circuit arranged to detect the output signal at the output of the control circuit, the detector circuit is operably connected between the output of the control circuit and the controller.

The detector circuit may be a voltage detector circuit or a current detector circuit. Preferably, the detector circuit is a high-pass filter circuit.

In one implementation, the detector circuit has an input and an output, the variable gain filter circuit has an input and an output; and the control circuit further comprises a first capacitor connected across the input of the detector circuit, and a second capacitor connected across the input of the variable gain filter circuit.

In one embodiment of the first aspect, the controlled signal source is a voltage source. Alternatively, the controlled signal source is a current source. Preferably, the controlled signal source is a voltage source while the detector circuit is a voltage detector circuit; and the controlled signal source is a current source while the detector circuit is a current detector circuit.

Preferably, the controlled signal source comprises a transformer, and the second gain factor is associated with, at least, the transformer turns ratio.

In one implementation, the control circuit is arranged between a power supply line and a power return line for suppressing a differential mode electromagnetic interference signal. In another implementation, the control circuit is arranged between a power supply line or a power return line or both and a reference ground line for suppressing a common mode electromagnetic interference signal.

In accordance with a second aspect of the invention, there is provided an integrated circuit comprising the control circuit of the first aspect.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1A:
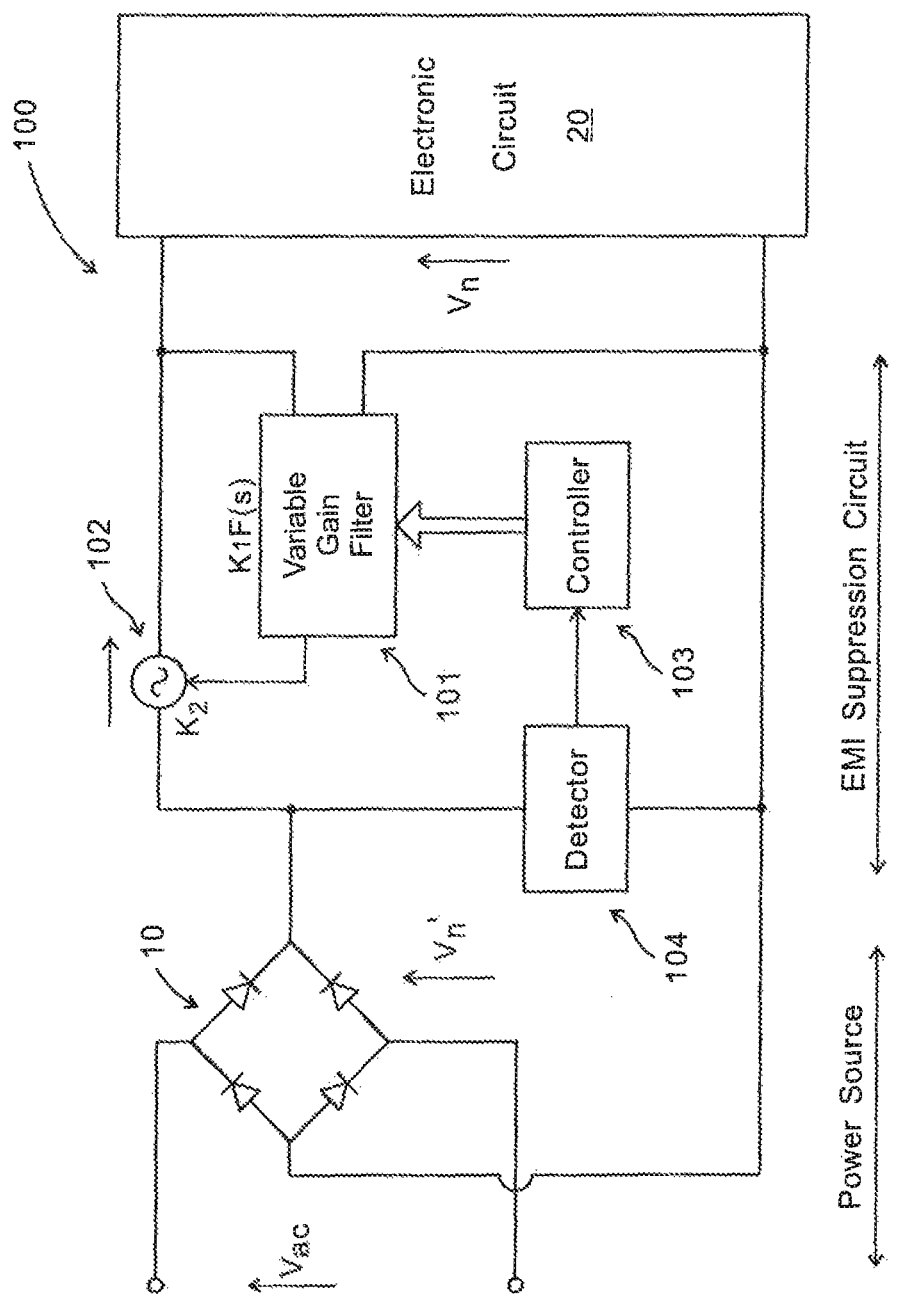
FIG. 1A is a simplified circuit diagram of a control circuit for suppressing differential mode electromagnetic interference signals in one embodiment of the invention.

FIG. 1A shows a control circuit 100 arranged between a power supply line and a power return line for suppressing differential mode electromagnetic interference signals in one embodiment of the invention. In FIG. 1A, the control circuit 100 is arranged between a power supply circuit 10 (labeled as "Power Source") and a load circuit 20 (labeled as "Electronic circuit"). The control circuit 100 has an input connected with the load circuit 20 and an output connected with the power supply circuit 10. In this embodiment, the power supply circuit 10 includes a diode rectifier bridge, operably connected with an AC power source (not shown).

The control circuit 100 includes a variable gain filter circuit 101 arranged to receive, at an input of the control circuit 100, an electromagnetic interference signal in the form of an electromagnetic interference signal voltage $v_n$ and to provide a signal to a controlled voltage source 102. The variable gain filter circuit 101 is preferably a high pass filter. In this embodiment, the variable gain filter circuit 101 has a transfer function $K_1F(s)$. The gain factor $K_1$ of the variable gain filter circuit 101 can be adjusted, for example, by varying a resistance in the variable gain filter circuit 101.

A controlled voltage source 102 is arranged in the control circuit 100, in the power supply line. The controlled voltage source 102 is arranged to receive an output from the variable gain filter circuit 101 and to, based on the received output, provide an output voltage signal to counteract, suppress, or eliminate the electromagnetic interference signal voltage $v_n$. The output voltage signal provided by the controlled voltage source 102 is preferably substantially 180 degrees out of phase with that of the electromagnetic interference signal voltage $v_n$, but with like or same amplitude as that of the electromagnetic interference signal voltage $v_n$.

The controlled voltage source 102 has a gain factor $K_2$, which may be fixed or adjustable. The controlled voltage source 102 preferably includes a transformer (not shown), in which case the gain factor $K_2$ is determined by, at least, the transformer turns ratio.

The control circuit 100 also includes a controller 103 operably connected with the variable gain filter circuit 101 to adjust gain factor $K_1$. The controller 103 may be formed by one or more CPU, MCU, controllers, logic circuits, Raspberry Pi chip, etc. The controller 103 is arranged to receive an electromagnetic interference signal indicative of an output electromagnetic interference signal at the output of the control circuit 100 and to output a control signal to the variable gain filter circuit 101 based on the received is signal indicative of the output electromagnetic interference signal so as to control the gain factor $K_1$ of the variable gain filter circuit 101. In this embodiment, the controller 103 is connected at its input with a voltage detector circuit 104 arranged to detect an output electromagnetic interference noise signal in the form of a voltage signal $v_n'$ at the output of the control circuit 100, for feedback control. The output electromagnetic interference noise signal is preferably a high frequency electromagnetic interference noise signal at the output of the control circuit 100, where there includes the output electromagnetic interference noise signal as well as the true signal. The voltage signal $v_n'$ reflects the performance of the control circuit 100, in particular how well it has suppressed the electromagnetic interference signal. The lower the voltage signal $v_n'$, the better the suppression performance. The voltage detector circuit 104 is preferably a high pass filter circuit, connected across the power supply line and the power return line.

Although not shown, an optional memory unit may be associated with the controller 103. The memory unit may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. The memory unit may be used to store predetermined control algorithms, thresholds, values, etc. for controlling the gain factor $K_1$.

In operation, the controller 103 in the control circuit 100 is arranged to control and adjust the gain factor $K_1$ such that the overall gain of $K_1$ times $K_2$ is controlled to be substantially equal to 1. The control and adjustment are based on the output voltage signal, i.e., the output electromagnetic interference noise signal $v_n'$. A large output electromagnetic interference noise signal $v_n'$ implies that adjustment of the factor $K_1$ is needed to improve electromagnetic interference signal suppression. By using the controller 103 to maintain the product of gain factor $K_1$ and $K_2$ to be at about 1, the voltage signal outputted by the controlled voltage source 102, being substantially a "negative" of the electromagnetic interference signal voltage $v_n$, can effectively suppress and substantially eliminate the electromagnetic interference signal voltage $v_n$, preventing the electromagnetic interference signal voltage from propagating to the power supply circuit 10.

Various modifications can be made to the control circuit 100. For example, in some embodiments, one or more gain stages may be added between the variable gain filter circuit 101 and the controlled voltage source 102, provided that the overall gain $K_1$ times $K_2$ times the overall gain of all added gain stage(s) is controlled to be substantially equal to 1. Alternatively, or additionally, one or more gain stages may be added between the controller 103 and the variable gain filter circuit 101. In some embodiments, the controlled voltage source 102 may be arranged at the power return line instead. The control circuit 100 need not be arranged after the diode rectifier bridge. The power supply need not be rectified AC source, but can also be other types of power source such as DC power source. In one example, the control circuit 100 can be arranged at the AC side before the diode rectifier bridge. The detection of the input electromagnetic interference noise voltage can be made directly or indirectly at any point in the circuit that includes correlated input electromagnetic interference noise voltage. Likewise, the detection of the feedback (or output) electromagnetic interference noise voltage can be made directly or indirectly at any point in the circuit that includes correlated feedback electromagnetic interference noise voltage. In some cases, especially in voltage sensing, indirect sensing of electromagnetic interference noise signals is desirable as it can substantially ameliorate high voltage breakdown requirements of circuit components.

Figure 1B:
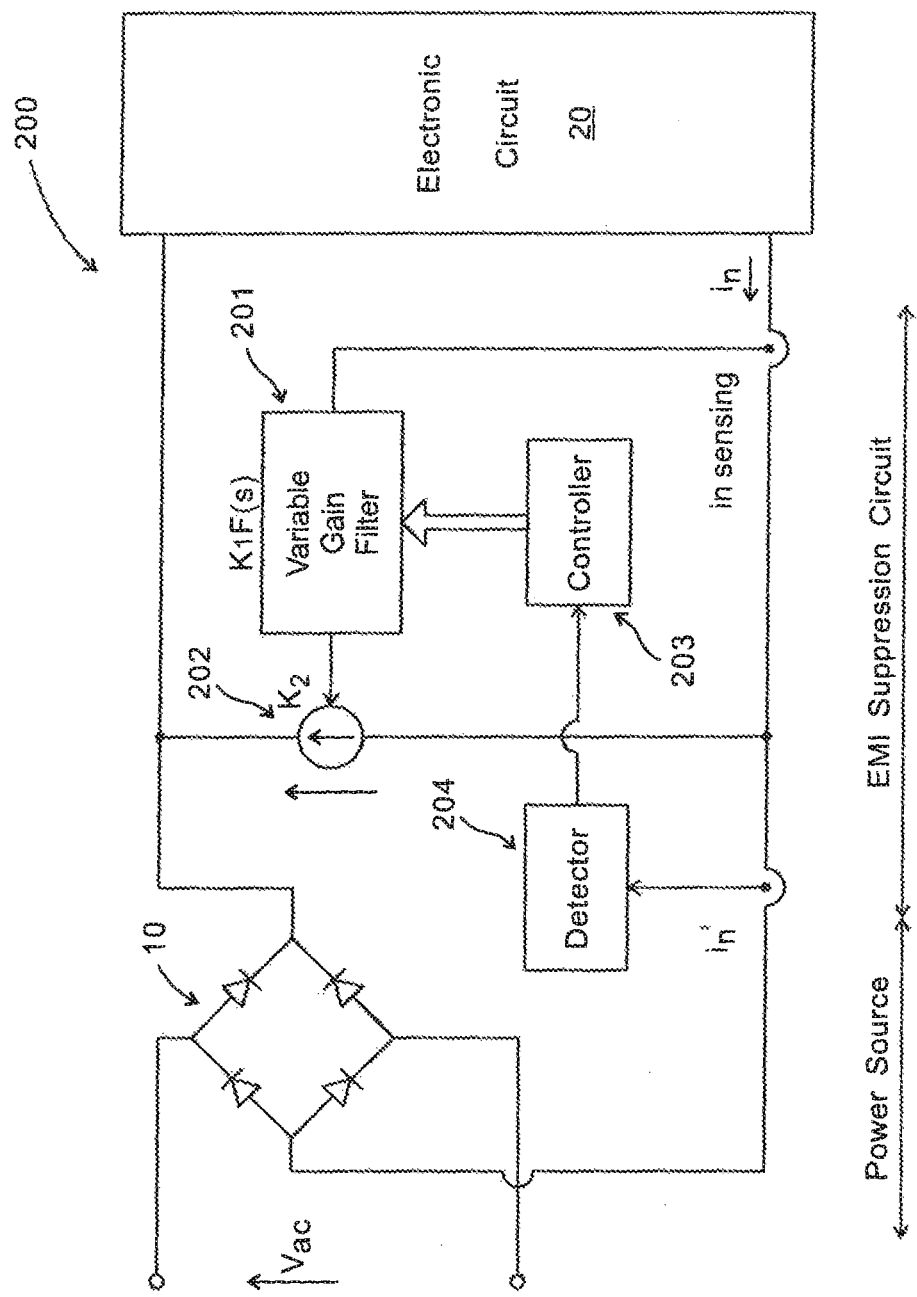
FIG. 1B is a simplified circuit diagram of a control circuit for suppressing differential mode electromagnetic interference signals in another embodiment of the invention.

FIG. 1B shows a control circuit 200 arranged between a power supply line and a power return line for suppressing differential mode electromagnetic interference signals in one embodiment of the invention. In FIG. 1B, the control circuit 200 is arranged between a power supply circuit 10 (labeled as "Power Source") and a load circuit 20 (labeled as "Electronic circuit"). The control circuit 200 has an input connected with the load circuit 20 and an output connected with the power supply circuit 10. In this embodiment, the power supply circuit 10 includes a diode rectifier bridge, operably connected with an AC power source (not shown).

The control circuit 200 includes a variable gain filter circuit 201 arranged to receive, at an input of the control circuit 200, an electromagnetic interference signal in the form of an electromagnetic interference signal current $i_n$ and to provide a signal to a controlled current source 202. The variable gain filter circuit 201 is preferably a high pass filter. In this embodiment, the variable gain filter circuit 201 has a transfer function $K_1F(s)$. The gain factor $K_1$ of the variable gain filter circuit 201 can be adjusted, for example, by varying a resistance in the variable gain filter circuit 201.

A controlled current source 202 is arranged in the control circuit 200, in or is connected to the power supply line. The controlled current source 202 is arranged to receive an output from the variable gain filter circuit 201 and to, based on the received output, provide an output current signal to counteract, suppress, or eliminate the electromagnetic interference signal current $i_n$. The output current signal provided by the controlled current source 202 is preferably substantially in phase with that of the electromagnetic interference signal current $i_n$, and with like or same amplitude with that of the electromagnetic interference signal current $i_n$. Kirchhoff's current law requires the sum of current at a particular circuit node to be always zero. Thus, by arranging the output current signal provided by the controlled current source 202 to be substantially in phase with that of the electromagnetic interference signal current $i_n$, the controlled current source 202 (or more generally the control circuit 200) provides a circulating path for the electromagnetic interference signal current $i_n$ to return to the load circuit 20, preventing the electromagnetic interference signal current $i_n$ from passing into the power supply circuit 10.

The controlled current source 202 has a gain factor $K_2$, which may be fixed or adjustable. The controlled current source 202 preferably includes a transformer (not shown), in which case the gain factor $K_2$ is determined by, at least, the transformer turns ratio.

The control circuit 200 also includes a controller 203 operably connected with the variable gain filter circuit 201 to adjust gain factor $K_1$. The controller 203 may be formed by one or more CPU, MCU, controllers, logic circuits, Raspberry Pi chip, etc. The controller 203 is arranged to receive an electromagnetic interference signal indicative of an output electromagnetic interference signal at the output of the control circuit 200 and to output a control signal to the variable gain filter circuit 201 based on the received signal indicative of the output electromagnetic interference signal so as to control the gain factor $K_1$ of the variable gain filter circuit 201. In this embodiment, the controller 203 is connected at its input with a current detector circuit 204 arranged to detect an output electromagnetic interference noise signal in the form of a current signal $i_n'$ at the power return line of the control circuit 200, for feedback control. The current signal $i_n'$ reflects the performance of the control circuit 200, in particular how well it has suppressed the electromagnetic interference signal. The output electromagnetic interference noise signal is preferably a high frequency electromagnetic interference is noise signal at the output of the control circuit 200, where there includes the output electromagnetic interference noise signal as well as the true signal. The lower the current signal $i_n'$, the better the suppression performance. The current detector circuit 204 is preferably a high pass filter circuit arranged at the power return line.

Although not shown, an optional memory unit may be associated with the controller 203. The memory unit may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. The memory unit may be used to store predetermined control algorithms, thresholds, values, etc. for controlling the gain factor $K_1$.

In operation, the controller 203 in the control circuit 200 is arranged to control and adjust the gain factor $K_1$ such that the overall gain of $K_1$ times $K_2$ is controlled to be substantially equal to 1. The control and adjustment are based on the output electromagnetic interference current signal $i_n'$. A large output electromagnetic interference noise signal $i_n'$ implies that adjustment of the factor $K_1$ is needed to improve interference suppression. By using the controller 203 to maintain the product of gain factor $K_1$ and $K_2$ to be at about 1, the current signal outputted by the controlled current source 202, being substantially the same phase and the same amplitude as the electromagnetic interference signal current, can effectively suppress and substantially eliminate the electromagnetic interference signal current $i_n$, preventing the electromagnetic interference signal current from propagating to the power supply circuit 10.

Various modifications can be made to the control circuit 200. For example, in some embodiments, one or more gain stages may be added between the variable gain filter circuit 201 and the controlled current source 202, provided that the overall gain $K_1$ times $K_2$ times the overall gain of all added gain stage(s) is controlled to be substantially equal to 1. Alternatively, or additionally, one or more gain stages may be added between the controller 203 and the variable gain filter circuit 201. In some embodiments, the current detector circuit 204 may be connected at the power supply line instead. The control circuit 200 need not be arranged after the diode rectifier bridge. The power supply need not be rectified AC source, but can also be other types of power source such as DC power source. In one example, the control circuit 200 can be arranged at the AC side before the diode rectifier bridge. The detection of the input electromagnetic interference noise signal can be made directly or indirectly at any point in the circuit that includes correlated input electromagnetic interference noise signal. Likewise, the detection of the feedback (or output) electromagnetic interference noise signal can be made directly or indirectly at any point in the circuit that includes correlated feedback electromagnetic interference noise signal.

Figure 2A:
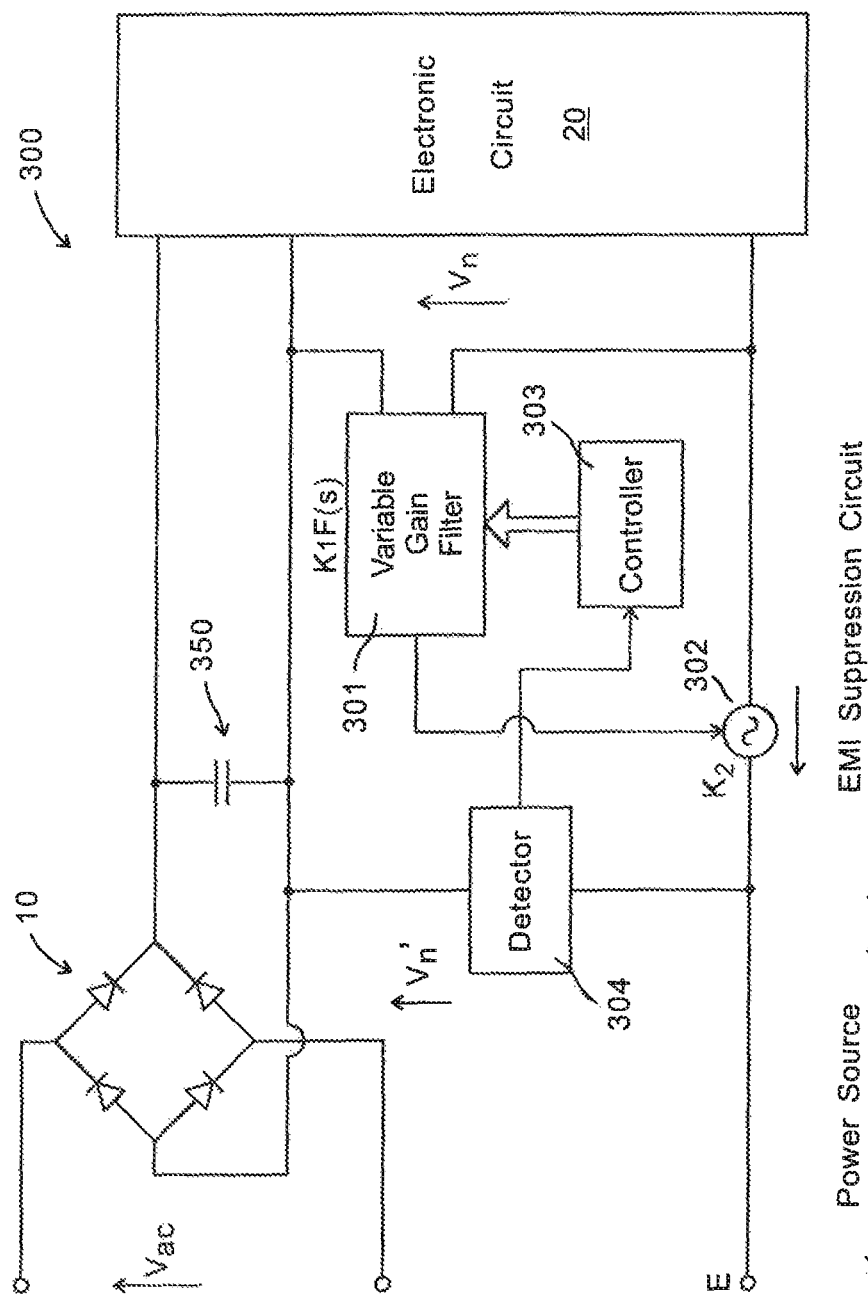
FIG. 2A is a simplified circuit diagram of a control circuit for suppressing common mode electromagnetic interference signals in one embodiment of the invention.

FIG. 2A shows a control circuit 300 arranged between a power return line and a ground line for suppressing common mode electromagnetic interference signals in one embodiment of the invention. In FIG. 2A, the control circuit 300 is arranged between a power supply circuit 10 (labeled as "Power Source") and a load circuit 20 (labeled as "Electronic circuit"). The control circuit 300 has an input connected with the load circuit 20 and an output connected with the power supply circuit 10. In this embodiment, the power supply circuit 10 includes a diode rectifier bridge, operably connected with an AC power source (not shown). A high frequency bypass capacitor 350 is connected across the power supply line and the power return line such that these two lines can be considered as AC shorted.

The control circuit 300 includes a variable gain filter circuit 301 arranged to receive, at an input of the control circuit 300, an electromagnetic interference signal in the form of a voltage signal $v_n$ (across the power return line and the ground line) and to provide a signal to a controlled voltage source 302. The variable gain filter circuit 301 is preferably a high pass filter. In this embodiment, the variable gain filter circuit 301 has a transfer function $K_1F(s)$. The gain factor $K_1$ of the variable gain filter circuit 301 can be adjusted, for example, by varying a resistance in the variable gain filter circuit 301.

A controlled voltage source 302 is arranged in the control circuit 300, in the ground line. The controlled voltage source 302 is arranged to receive an output from the variable gain filter circuit 301 and to, based on the received output, provide an output voltage signal to counteract, suppress, or eliminate the electromagnetic interference signal voltage $v_n$.

The output voltage signal provided by the controlled voltage source 302 is preferably substantially 180 degrees out of phase with that of the electromagnetic interference signal voltage $v_n$, but with like or same amplitude as that of the electromagnetic interference signal voltage $v_n$.

The controlled voltage source 302 has a gain factor $K_2$, which may be fixed or adjustable. The controlled voltage source 302 preferably includes a transformer (not shown), in which case the gain factor $K_2$ is determined by, at least, the transformer turns ratio.

The control circuit 300 also includes a controller 303 operably connected with the variable gain filter circuit 301 to adjust gain factor $K_1$. The controller 303 may be formed by one or more CPU, MCU, controllers, logic circuits, Raspberry Pi chip, etc. The controller 303 is arranged to receive an electromagnetic interference signal indicative of an output electromagnetic interference signal at the output of the control circuit 300 and to output a control signal to the variable gain filter circuit 301 based on the received signal indicative of the output electromagnetic interference signal so as to control the gain factor $K_1$ of the variable gain filter circuit 301. In this embodiment, the controller 303 is connected at its input with a voltage detector circuit 304 arranged to detect an output electromagnetic interference noise signal in the form of a voltage signal $v_n'$ at the output of the control circuit 300, across the power return line and the ground line, for feedback control. The output electromagnetic interference noise signal is preferably a high frequency electromagnetic interference noise signal at the output of the control circuit 300, where there includes the output electromagnetic interference noise signal as well as the true signal. The output electromagnetic interference voltage signal $v_n'$ reflects the performance of the control circuit 300, in particular how well it has suppressed the electromagnetic interference signal. The lower the electromagnetic interference voltage signal $v_n'$, the better the suppression performance. The voltage detector circuit 304 is preferably a high pass filter circuit, connected across the power return line and the ground line.

Although not shown, an optional memory unit may be associated with the controller 303. The memory unit may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. The memory unit may be used to store predetermined control algorithms, thresholds, values, etc. for controlling the gain factor $K_1$.

In operation, the controller 303 in the control circuit 300 is arranged to control and adjust the gain factor $K_1$ such that the overall gain of $K_1$ times $K_2$ is controlled to be substantially equal to 1. The control and adjustment are based on the output is electromagnetic interference voltage signal $v_n'$. A large output electromagnetic interference noise signal $v_n'$ implies that adjustment of the factor $K_1$ is needed to improve interference suppression. By using the controller 303 to maintain the product of gain factor $K_1$ and $K_2$ to be at about 1, the voltage signal outputted by the controlled voltage source 302, being substantially a "negative" of the electromagnetic interference signal voltage, can effectively suppress and substantially eliminate the electromagnetic interference signal voltage $v_n$, preventing the electromagnetic interference signal voltage from propagating to the power supply circuit 10.

Various modifications can be made to the control circuit 300. For example, in some embodiments, one or more gain stages may be added between the variable gain filter circuit 301 and the controlled voltage source 302, provided that the overall gain $K_1$ times $K_2$ times the overall gain of all added gain stage(s) is controlled to be substantially equal to 1. Alternatively, or additionally, one or more gain stages may be added between the controller 303 and the variable gain filter circuit 301. In some embodiments, the controlled voltage source 302 may be arranged at the power supply line, at the power return line, or simultaneously at both the power supply line and the power return line. The control circuit 300 need not be arranged after the diode rectifier bridge. The power supply need not be rectified AC source, but can also be other types of power source such as DC power source. In one example, the control circuit 300 can be arranged at the AC side before the diode rectifier bridge. The detection of the input electromagnetic interference noise signal can be made directly or indirectly at any point in the circuit that includes correlated input electromagnetic interference noise signal. Likewise, the detection of the feedback (or output) electromagnetic interference noise signal can be made directly or indirectly at any point in the circuit that includes correlated feedback electromagnetic interference noise signal. In some cases, especially in voltage sensing, indirect sensing of electromagnetic interference noise signals is desirable, as it can substantially ameliorate high voltage breakdown requirements of circuit components.

Figure 2B:
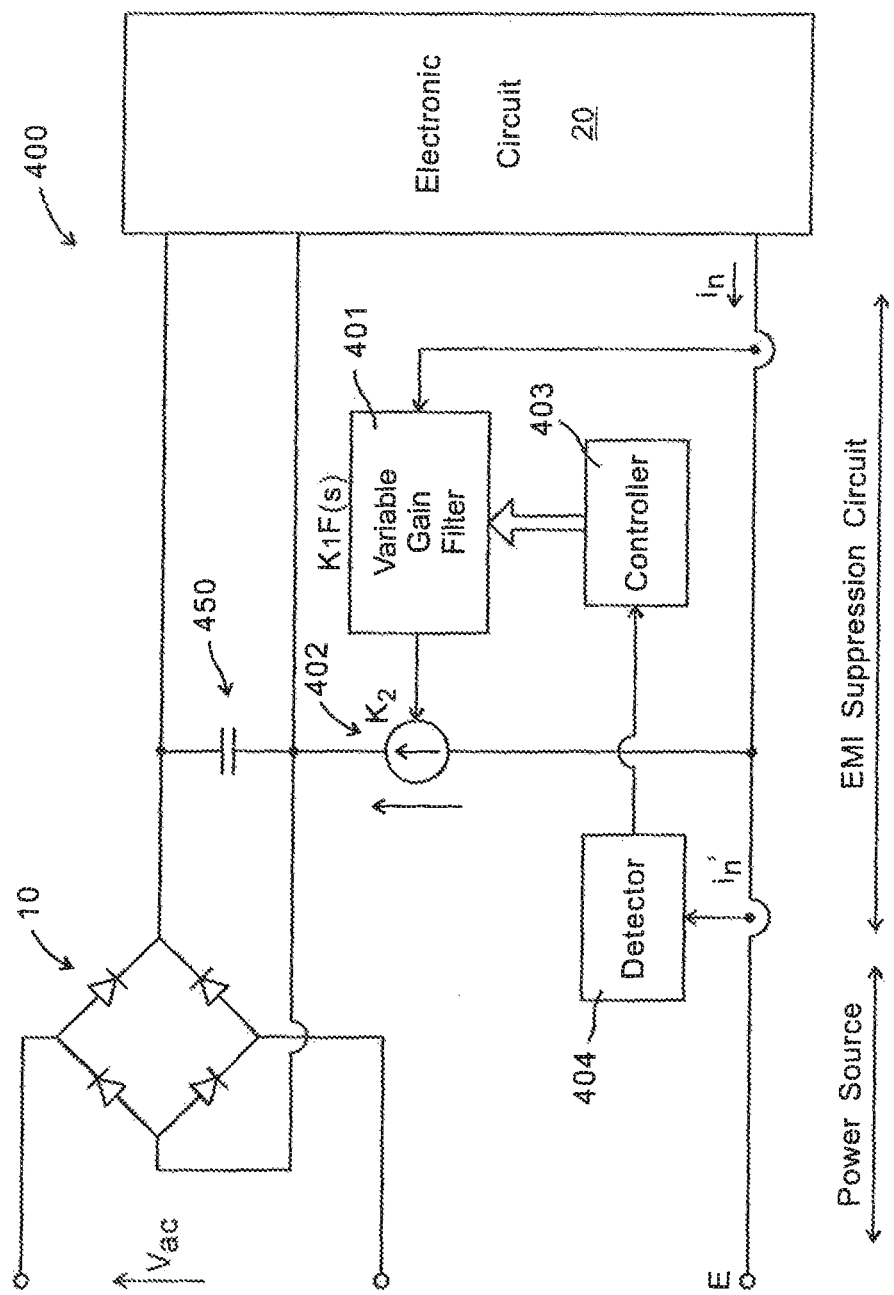
FIG. 2B is a simplified circuit diagram of a control circuit for suppressing common mode electromagnetic interference signals in another embodiment of the invention.

FIG. 2B shows a control circuit 400 arranged between a power return line and a ground line for suppressing common mode electromagnetic interference signals in one embodiment of the invention. In FIG. 2B, the control circuit 400 is arranged between a power supply circuit 10 (labeled as "Power Source") and a load circuit 20 (labeled as "Electronic circuit"). The control circuit 400 has an input connected with the load circuit 20 and an output connected with the power supply circuit 10. In this embodiment, the power supply circuit 10 includes a diode rectifier bridge, operably connected with an AC power source (not shown). A high frequency bypass capacitor 450 is connected across the power supply line and the power return line such that these two lines can be considered as AC shorted.

The control circuit 400 includes a variable gain filter circuit 401 arranged to receive, at an input of the control circuit 400, an electromagnetic interference signal in the form of a current signal $i_n$ and to provide a signal to a controlled current source 402. The variable gain filter circuit 401 is preferably a high pass filter. In this embodiment, the variable gain filter circuit 401 has a transfer function $K_1 F(s)$. The gain factor $K_1$ of the variable gain filter circuit 401 can be adjusted, for example, by varying a resistance in the variable gain filter circuit 401.

A controlled current source 402 is arranged in the control circuit 400, in or connected to the power supply line. The controlled current source 402 is arranged to receive an output from the variable gain filter circuit 401 and to, based on the received output, provide an output current signal to counteract, suppress, or eliminate the electromagnetic interference signal current $i_n$. The output current signal provided by the controlled current source 402 is preferably substantially in phase with that of the electromagnetic interference signal current $i_n$, and with like or same amplitude as that of the electromagnetic interference signal current $i_n$. Kirchhoff's current law requires the sum of current at a particular circuit node to be always zero. Thus, by arranging the output current signal provided by the controlled current source 402 to be substantially in phase with that of the electromagnetic interference signal current $i_n$, the controlled current source 402 (or more generally the control circuit 400) provides a circulating path for the electromagnetic interference signal current $i_n$ to return to the load circuit 20, preventing the electromagnetic interference signal current $i_n$ from passing into the power supply circuit 10.

The controlled current source 402 has a gain factor $K_2$, which may be fixed or adjustable. The controlled current source 402 preferably includes a transformer (not shown), in which case the gain factor $K_2$ is determined by, at least, the transformer turns ratio.

The control circuit 400 also includes a controller 403 operably connected with the is variable gain filter circuit 401 to adjust gain factor $K_1$. The controller 403 may be formed by one or more CPU, MCU, controllers, logic circuits, Raspberry Pi chip, etc. The controller 403 is arranged to receive an electromagnetic interference signal indicative of an output electromagnetic interference signal at the output of the control circuit 400 and to output a control signal to the variable gain filter circuit 401 based on the received signal indicative of the output electromagnetic interference signal so as to control the gain factor $K_1$ of the variable gain filter circuit 401. In this embodiment, the controller 403 is connected at its input with a current detector circuit 404 arranged to detect an output electromagnetic interference noise signal in the form of a current signal $i_n'$ at the ground line of the control circuit 400, for feedback control. The current signal $i_n'$ reflects the performance of the control circuit 400, in particular how well it has suppressed the electromagnetic interference signal. The output electromagnetic interference noise signal is preferably a high frequency electromagnetic interference noise signal at the output of the control circuit 400, where there includes the output electromagnetic interference noise signal as well as the true signal. The lower the electromagnetic interference current signal $i_n'$, the better the suppression performance. The current detector circuit 404 is preferably a high pass filter circuit arranged at the ground line.

Although not shown, an optional memory unit may be associated with the controller 403. The memory unit may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. The memory unit may be used to store predetermined control algorithms, thresholds, values, etc. for controlling the gain factor $K_1$.

In operation, the controller 403 in the control circuit 400 is arranged to control and adjust the gain factor $K_1$ such that the overall gain of $K_1$ times $K_2$ is controlled to be substantially equal to 1. The control and adjustment are based on the output electromagnetic interference noise signal $i_n'$. A large output electromagnetic interference noise signal $i_n'$ implies that adjustment of the factor $K_1$ is needed to improve interference suppression. By using the controller 403 to maintain the product of gain factor $K_1$ and $K_2$ to be at about 1, the current signal outputted by the controlled current source 402, being substantially in phase with the electromagnetic interference signal current, can effectively suppress and substantially eliminate the electromagnetic interference signal current $i_n$, preventing the electromagnetic interference signal current from propagating to the power supply circuit 10.

Various modifications can be made to the control circuit 400. For example, in some embodiments, one or more gain stages may be added between the variable gain filter circuit 401 and the controlled current source 402, provided that the overall gain $K_1$ times $K_2$ times the overall gain of all added gain stage(s) is controlled to be substantially equal to 1. Alternatively, or additionally, one or more gain stages may be added between the controller 403 and the variable gain filter circuit 401. In some embodiments, the controlled current source 402 may be arranged at the power supply line, at the power return line, or simultaneously at both the power supply line and the power return line. The current detector circuit 404 may be arranged at the power supply line, at the power return line, or simultaneously at both the power supply line and the power return line. The control circuit 400 need not be arranged after the diode rectifier bridge. The power supply need not be rectified AC source, but can also be other types of power source such as DC power source. In one example, the control circuit 400 can be arranged at the AC side before the diode rectifier bridge. The detection of the input electromagnetic interference noise signal can be made directly or indirectly at any point in the circuit that includes correlated input electromagnetic interference noise signal. Likewise, the detection of the feedback (or output) electromagnetic interference noise signal can be made directly or indirectly at any point in the circuit that includes correlated feedback electromagnetic interference noise signal.

Figure 3A:
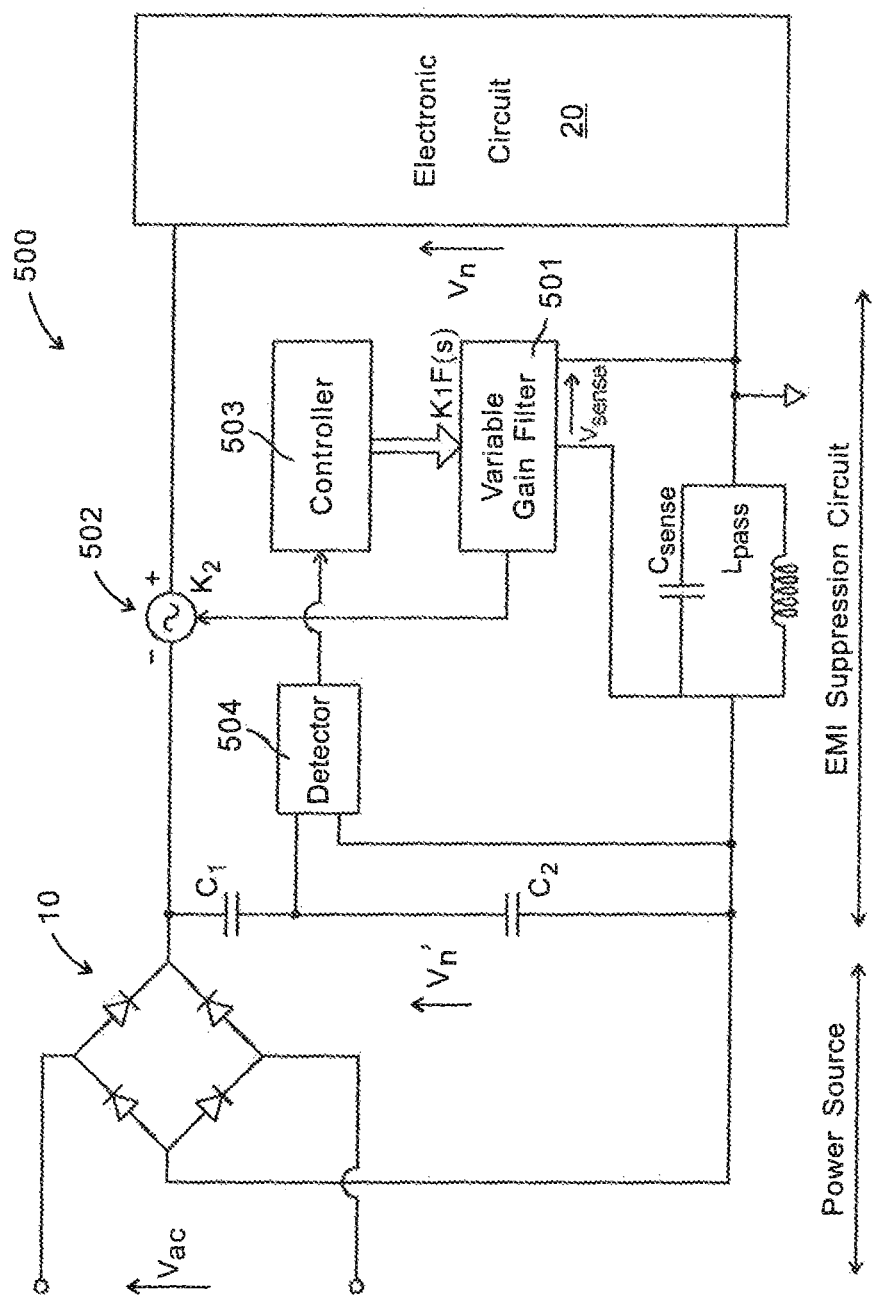
FIG. 3A is a simplified circuit diagram of a control circuit for suppressing differential mode electromagnetic interference signals in a preferred embodiment of the invention.

FIG. 3A shows a control circuit 500 arranged between a power supply line and a power return line for suppressing differential mode electromagnetic interference signals in one embodiment of the invention. The control circuit 500 in this embodiment is similar to the control circuit 100 of FIG. 1A. The main difference is that in this embodiment indirect electromagnetic interference noise signal sensing is implemented. For simplicity, the following only describes these differences. The skilled person would appreciate that the other aspects of the circuit 500 are the same as that of circuit 100 and its variation. Modification that can be applied to control circuit 100 can likewise be applied to control circuit 500, as far as possible, without hindering implementation of the differences.

In the control circuit 500, the sensing or detection of the electromagnetic interference noise signal at the input of the control circuit 500 and the feedback electromagnetic interference noise signal at the output of the control circuit 500 is performed indirectly, via capacitive divider formed by capacitors $C_1$, $C_2$, and $C_{sense}$. The capacitors $C_1$ and $C_2$ are connected in series, across the power supply line and the power return line. The capacitor $C_{sense}$ is connected in series on the power return line, as part of a LC tank. In this embodiment, the variable gain filter circuit 501 takes voltage signal $v_{sense}$ across the LC tank as the input. The voltage detector circuit 504 takes an electromagnetic interference voltage signal across capacitor $C_2$ as the output electromagnetic interference noise signal for feedback control. In this embodiment, the voltage signal $v_{sense}$ relates to the electromagnetic interference noise signal $v_n$ by:

$$v_{sense} = \frac{(C_1 seriesC_2)v_n}{(C_1 seriesC_2) + C_{sense}}$$

The condition for achieving perfect (theoretical) cancellation of the electromagnetic interference noise signal is thus:

$$\frac{(C_1 seriesC_2)}{(C_1 seriesC_2) + C_{sense}} K_1 K_2 = -1$$

The variable gain controlled by the controller 503 is preferably $$K_1 K_2 = -\frac{((C_1 seriesC_2) + C_{sense})}{(C_1 seriesC_2)}$$

Various modifications can be made to the control circuit 500. For example, the capacitive divider can be implemented using more capacitors, at different locations. The LC tank can be arranged in the power supply line instead.

Figure 3B:
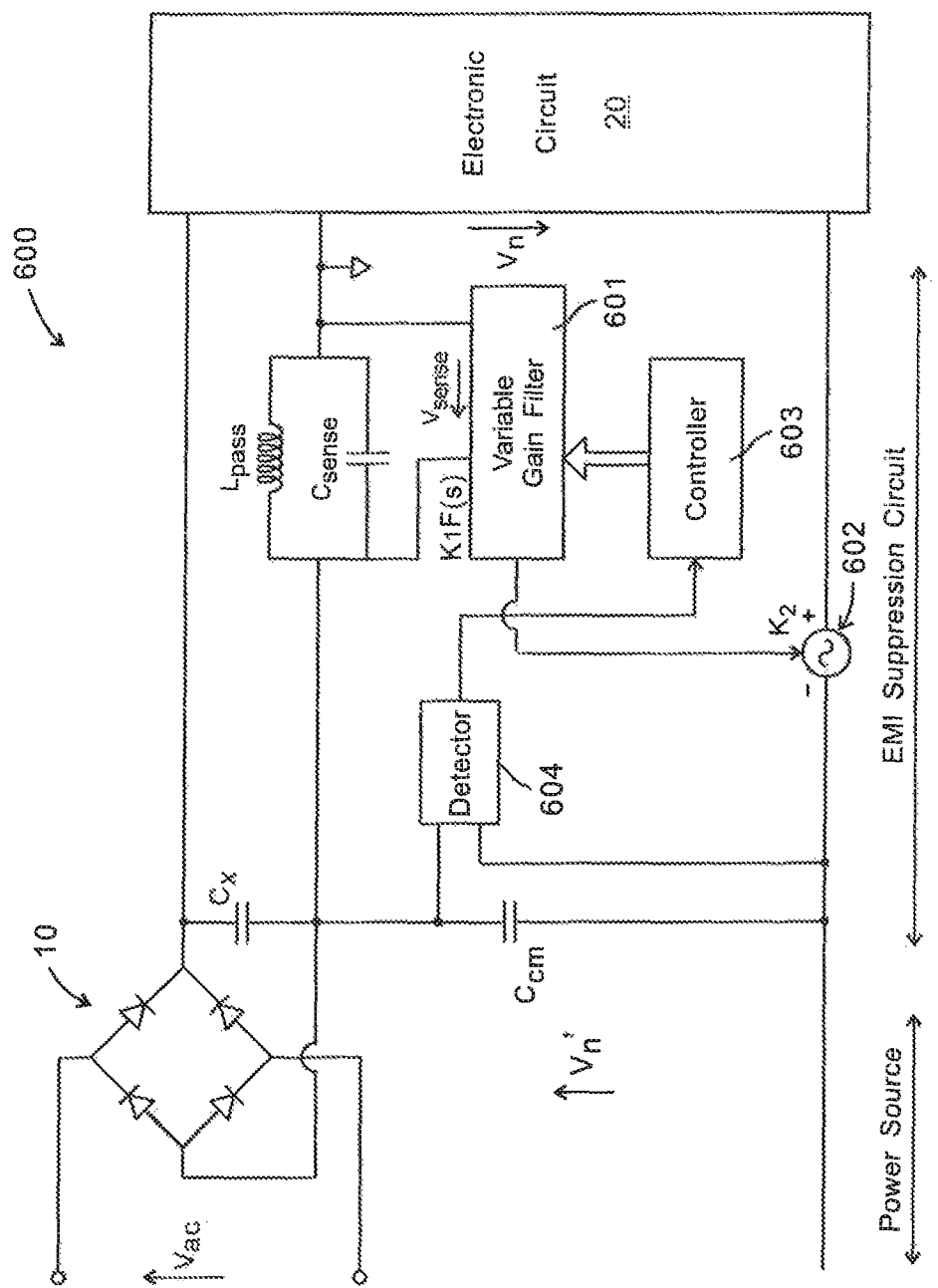
FIG. 3B is a simplified circuit diagram of a control circuit for suppressing common mode electromagnetic interference signals in a preferred embodiment of the invention.

FIG. 3B shows a control circuit 600 arranged between a power return line and a ground line for suppressing common mode electromagnetic interference signals in one embodiment of the invention. The control circuit 600 in this embodiment is similar to the control circuit 300 of FIG. 2A. The main difference is that in this embodiment indirect electromagnetic interference noise signal sensing is implemented. For simplicity, the following only describes these differences. The skilled person would appreciate that the other aspects of the circuit 600 are the same as that of circuit 300 and its variation. Modification that can be applied to control circuit 300 can likewise be applied to control circuit 600, as far as possible, without hindering implementation of the differences.

In the control circuit 600, the sensing or detection of the electromagnetic interference noise signal at the input of the control circuit 600 and the feedback electromagnetic interference noise signal at the output of the control circuit 600 is performed indirectly, via capacitive divider formed by capacitors $C_{cm}$ and $C_{sense}$. The capacitor $C_m$ is connected in series across the power return line and the ground line. The capacitor $C_{sense}$ is connected in series on the power return line, as part of a LC tank. In this embodiment, the variable gain filter circuit 601 takes voltage signal $v_{sense}$ across the LC tank as the input. The voltage detector circuit 604 takes a voltage signal across capacitor $C_2$ as the output electromagnetic interference noise signal for feedback control. In this embodiment, the voltage signal $v_{sense}$ relates to the electromagnetic interference noise signal $v_n$ by:

$$V_{sense} = \frac{C_{cm} v_n}{C_{cm} + C_{sense}}$$

The condition for achieving perfect (theoretical) cancellation of the electromagnetic interference noise signal is thus:

$$\frac{C_{cm}}{C_{cm} + C_{sense}} K_1 K_2 = -1$$

The variable gain controlled by the controller 603 is preferably $$K_1 K_2 = -\frac{(C_{cm} + C_{sense})}{C_{cm}}$$

Various modifications can be made to the control circuit 600. For example, the capacitive divider can be implemented using more capacitors, at different locations. The LC tank can be arranged in the ground line instead.

Figure 4:
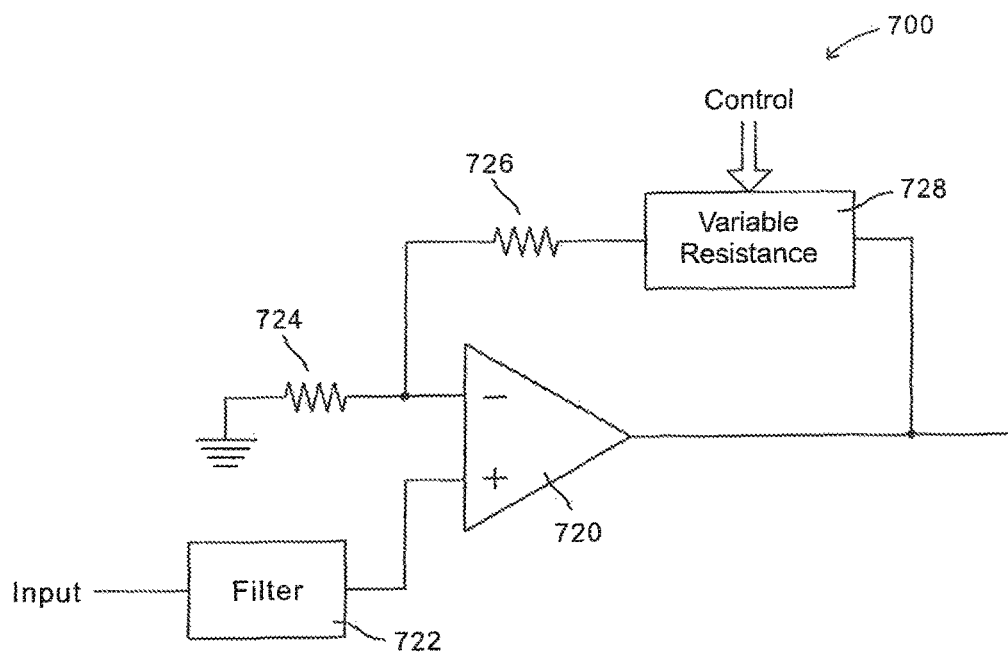
FIG. 4 is a simplified circuit diagram of a variable gain filter circuit that can be used in the control circuit of FIGS. 1A to 3B in one embodiment of the invention.

FIG. 4 shows a variable gain filter circuit 700 that can be used in the control circuit of FIGS. 1A to 3B in one embodiment of the invention. In this embodiment, the variable gain filter circuit 700 includes an operational amplifier 720 with an inverting input, a non-inverting input, and an output. A filter circuit is connected to the non-inverting input. A first resistor 724, grounded, is connected with the inverting input. A second resistor 726 and a variable resistance circuit 728 are connected between the inverting input and the output of the operational amplifier 720. The variable resistance circuit provides a resistance that can be varied by a control signal, such as that from a controller, to change the gain factor $K_1$.

The variable gain filter circuit 700 can be implemented using a circuit with a resistor network, a capacitor network, an inductor network, or any of their combination.

Figure 5A:
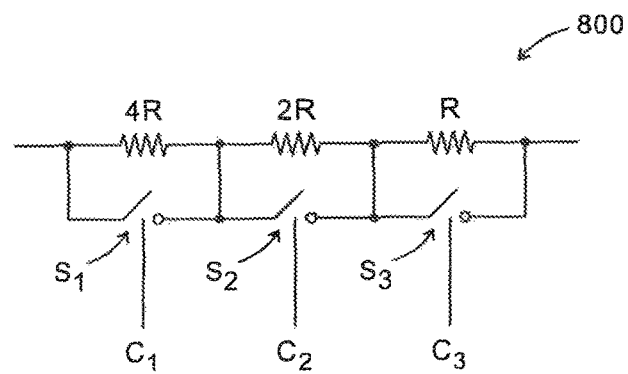
FIG. 5A is a circuit diagram of a variable resistance circuit in the variable gain filter circuit of FIG. 4 in one embodiment of the invention.

FIG. 5A shows a variable resistance circuit 800 in the variable gain filter circuit of FIG. 4 in one embodiment of the invention. The variable resistance circuit 800 includes three resistors R, 2R, 4R, each respective connected in parallel with a switch $S_1$, $S_2$, $S_3$. Each of the switches $S_1$, $S_2$, $S_3$ is arranged to receive a respective control signal $C_1$, $C_2$, $C_3$. By selectively controlling on and off of the switches $S_1$, $S_2$, $S_3$, the equivalent resistance of the variable resistance circuit 800 can be changed to affect the gain factor $K_1$. In this embodiment, the equivalent resistance of the circuit 800 can change from 0 to 7R with incremental steps of R.

Figure 5B:
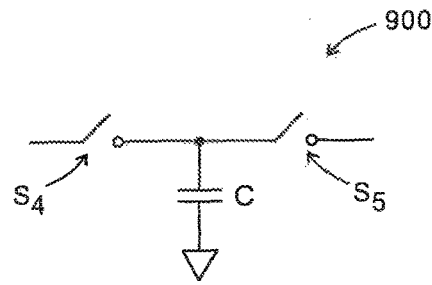
FIG. 5B is a circuit diagram of a variable resistance circuit in the variable gain filter circuit of FIG. 4 in another embodiment of the invention.

FIG. 5B is a variable resistance circuit 900 in the variable gain filter circuit of FIG. 4 in another embodiment of the invention. In this embodiment, the circuit 900 includes a switched capacitor, a capacitor C operably connected at two ends with a respective switch $S_4$, $S_5$. Each of the switches $S_4$, $S_5$ is arranged to receive a respective control signal. By selectively controlling on and off of the switches $S_4$, $S_5$, the equivalent resistance of the variable resistance circuit 900 can be changed to affect the gain factor $K_1$. In this embodiment, the equivalent resistance of the circuit 900 is a function of switching frequency.

Various modifications can be made to the variable resistance circuits 800, 900. For example, the number and resistance of the resistors in circuit 800 can be modified based on applications. The number and capacitance of the capacitor in circuit 900 can be modified based on applications.

The control circuits in all of the above embodiments can be readily embodied in an integrated circuit.

Terms of degree such as "about", "substantially", or the like, are used in the above description to clearly account for the general tolerances associated with the various circuit components and inevitable minor signal fluctuation in practice.

The above embodiments of the invention provide a variable gain control circuit, the gain factor of which can be adjusted as needed to ensure that the overall gain of the circuit can be maintained at or substantially at 1, to improve interference suppression performance. This aspect is particularly advantageous because the overall gain or gain product can be affected by various factors, such as resistor ratio and hence the tolerance of resistors used (resistor matching);
changes in resistor matching over different operating temperature;
changes in resistor matching over time due to different degradation effects; and
transformer ratio if the controlled voltage or current source includes a transformer and will give rise to performance variation during production as well as throughout the operating life of products. By flexibly and readily adjusting the gain factor as needed, resistor mismatch, component tolerances (e.g., capacitor or resistor tolerances), and components changes or degrades over time (e.g., capacitance or resistance changes over time), variations in transformer ratio, etc., can all be readily and properly compensated.

It will be appreciated by persons skilled in the art that numerous variations and/or modifications may be made to the invention as shown in the specific embodiments without departing from the spirit or scope of the invention as broadly described.

The described embodiments of the invention should therefore be considered in all respects as illustrative, not restrictive.

The invention claimed is:

1. A control circuit for suppressing electromagnetic interference signals, the control circuit comprising:
    an input and an output;
    a variable gain filter circuit with a first gain factor, wherein
        the first gain factor is variable, and
        the variable gain filter circuit receives a signal indicative of an electromagnetic interference signal, and outputs a signal to a controlled signal source with a second gain factor; and
    a controller operably connected to the variable gain filter circuit, wherein the controller receives a signal indicative of an output signal at the output of the control circuit, and outputs a control signal to the variable gain filter circuit based on the signal indicative of the output signal at the output of the control circuit, and the control signal controls the first gain factor.

2. The control circuit of claim 1, further comprising the controlled signal source, wherein the controlled signal source
    receives the signal outputted from the variable gain filter circuit; and
    outputs a suppression signal for suppressing transfer of an electromagnetic interference signal from a first circuit part to a second circuit part.

3. The control circuit of claim 2, wherein
    the first circuit part is connected to the input of the control circuit,
    the first circuit part comprises a load circuit,
    the second circuit part is connected to the output of the control circuit, and
    the second circuit part comprises a power supply circuit.

4. The control circuit of claim 2, wherein
    the suppression signal has a first phase and the electromagnetic interference signal has a second phase, and,
    when the electromagnetic interference signal is a voltage signal, the suppression signal and the electromagnetic interference signal are out of phase by about 180 degrees, and,
    when the electromagnetic interference signal is a current signal, the suppression signal and the electromagnetic interference signal are substantially in phase.

5. The control circuit of claim 4, wherein
    the suppression signal has a first magnitude and the electromagnetic interference signal has a second magnitude, and
    the first magnitude and the second magnitude are substantially the same.

6. The control circuit of claim 2, wherein the control signal adjusts the first gain factor such that the product of the first gain factor and the second gain factor is substantially equal to one.

7. The control circuit of claim 2, wherein the controlled signal source is a voltage source.

8. The control circuit of claim 2, wherein the controlled signal source is a current source.

9. The control circuit of claim 2, wherein
the controlled signal source comprises a transformer having a turns ratio, and
the second gain factor is associated with, at least, the turns ratio.

10. The control circuit of claim 1, wherein the variable gain filter circuit is a high pass filter circuit.

11. The control circuit of claim 1, wherein the variable gain filter circuit comprises:
an operational amplifier with an inverting input, a non-inverting input, and an output; and
a variable resistance circuit connected between the inverting input and the output of the operational amplifier, wherein the variable resistance circuit has a resistance that can be varied to change the first gain factor.

12. The control circuit of claim 11, wherein
the variable resistance circuit comprises a plurality of resistors and a plurality of switches, and
each resistor is connected in parallel with a respective one of the switches.

13. The control circuit of claim 11, wherein the variable resistance circuit comprises a switched capacitor.

14. The control circuit of claim 1, wherein the electromagnetic interference signal is one of a voltage signal and a current signal present at the input of the control circuit.

15. The control circuit of claim 1, wherein the signal indicative of an electromagnetic interference signal is at least a portion of the electromagnetic interference signal.

16. The control circuit of claim 1, further comprising a detector circuit detecting the output signal at the output of the control circuit, wherein the detector circuit is operably connected between the output of the control circuit and the controller.

17. The control circuit of claim 16, wherein the detector circuit is a voltage detector circuit.

18. The control circuit of claim 16, wherein the detector circuit is a current detector circuit.

19. The control circuit of claim 16, wherein the detector circuit is a high-pass filter circuit.

20. The control circuit of claim 16, wherein
the detector circuit has an input and an output,
the variable gain filter circuit has an input and an output, and
the control circuit further comprises a first capacitor connected across the input of the detector circuit, and a second capacitor connected across the input of the variable gain filter circuit.

21. The control circuit of claim 1, wherein the control circuit is arranged between a power supply line and a power return line for suppressing a differential mode electromagnetic interference signal.

22. The control circuit of claim 1, wherein the control circuit is arranged between
(a) a power supply line, a power return line, or both a power supply line and a power return line, and
(b) a reference ground line for suppressing a common mode electromagnetic interference signal.

23. An integrated circuit comprising the control circuit of claim 1.

* * * * *